US010985042B2

(12) United States Patent
Nishihara et al.

(10) Patent No.: US 10,985,042 B2
(45) Date of Patent: Apr. 20, 2021

(54) SIC SUBSTRATE, SIC EPITAXIAL WAFER, AND METHOD OF MANUFACTURING THE SAME

(71) Applicant: SHOWA DENKO K.K., Tokyo (JP)

(72) Inventors: Yoshitaka Nishihara, Chichibu (JP); Koji Kamei, Hikone (JP)

(73) Assignee: SHOWA DENKO K.K., Tokyo (JP)

( * ) Notice: Subject to any disclaimer, the term of this patent is extended or adjusted under 35 U.S.C. 154(b) by 0 days.

(21) Appl. No.: 16/599,645

(22) Filed: Oct. 11, 2019

(65) Prior Publication Data

US 2020/0118854 A1 Apr. 16, 2020

(30) Foreign Application Priority Data

Oct. 16, 2018 (JP) .............................. JP2018-195266

(51) Int. Cl.
 *H01L 21/02* (2006.01)
 *H01L 21/67* (2006.01)
 *C30B 29/06* (2006.01)
 *C30B 29/36* (2006.01)

(52) U.S. Cl.
 CPC ........ *H01L 21/67288* (2013.01); *C30B 29/06* (2013.01); *C30B 29/36* (2013.01); *H01L 21/02167* (2013.01)

(58) Field of Classification Search
 CPC ......... H01L 21/67288; H01L 21/02167; H01L 21/02378; H01L 21/02529; H01L 29/1608; H01L 21/02634; H01L 21/67271
 See application file for complete search history.

(56) References Cited

U.S. PATENT DOCUMENTS 7,081,420 B2 * 7/2006 Kamata .................. C30B 29/36
 438/778

FOREIGN PATENT DOCUMENTS

JP 2016-127201 A 7/2016

\* cited by examiner

*Primary Examiner* — David Vu
(74) *Attorney, Agent, or Firm* — Sughrue Mion, PLLC (57) ABSTRACT

A SiC substrate includes a first principal surface, a second principal surface disposed on a side opposite to the first principal surface, and an outer periphery connected to the first principal surface and the second principal surface, wherein a density of composite defects present at a peripheral edge portion of the SiC substrate, in which a hollow portion and a dislocation line extending from the hollow portion are connected to each other is equal to or greater than 0.01 pieces/cm² and equal to or less than 10 pieces/cm².

5 Claims, 7 Drawing Sheets

SIC SUBSTRATE, SIC EPITAXIAL WAFER, AND METHOD OF MANUFACTURING THE SAME

BACKGROUND OF THE INVENTION

Field of the Invention

The present invention relates to a SiC substrate, a SiC epitaxial wafer, and a method of manufacturing the same.

Priority is claimed on Japanese Patent Application No. 2018-195266 filed on Oct. 16, 2018, the content of which is incorporated herein by reference.

Background Art

Silicon carbide (SiC) has characteristics such as a dielectric breakdown electric field one order of magnitude larger, a band gap three times larger, and a thermal conductivity approximately three times higher than that of silicon (Si). Since silicon carbide has these characteristics, it is expected that the silicon carbide will be applied to power devices, high-frequency devices, high-temperature operating devices, and the like. For this reason, in recent years, SiC epitaxial wafers have been used for the above-described semiconductor devices.

In order to promote the practical application of SiC devices, it is essential to establish a high-quality crystal growth technique and a high-quality epitaxial growth technique.

SiC devices are generally manufactured using a SiC epitaxial wafer obtained by growing a SiC epitaxial layer (film) serving as an activated region of a device on a SiC single crystal substrate (may also be simply referred to as a SiC substrate), obtained by being processed from SiC bulk single crystal grown by sublimation recrystallization method or the like, through chemical vapor deposition (CVD) or the like.

More specifically, SiC epitaxial wafers are generally obtained by performing step flow growth (lateral growth from atomic steps) on a SiC single crystal substrate having a surface with an off-angle in a <11-20> direction from a (0001) plane as a growth surface to grow a 4H-SiC epitaxial layer.

A SiC single crystal substrate includes various defects such as micropipes. It is known that these defects can adversely affect the operation of various devices due to the propagation of the defects into an epitaxial layer during the manufacture of a SiC epitaxial wafer, that is, during the growth of a SiC epitaxial layer on a SiC single crystal substrate.

In particular, a micropipe is a fatal defect, and when a plurality of devices are manufactured on one SiC single crystal substrate, a device formed on the micropipe is treated as a defective product (see, for example, Japanese Unexamined Patent Application, First Publication No. 2016-127201). For this reason, the development of a substrate manufacturing technique for reducing the density of micropipes in a SiC single crystal substrate and a crystal growth technique for reducing the propagation of micropipes from a SiC single crystal substrate to an epitaxial layer have progressed.

Here, a micropipe is a hollow crystal defect that has an approximately sub-μm to several μm diameter and propagates in a c-axis direction of hexagonal silicon carbide. It is generally thought that the micropipe is formed so that a screw dislocation having a large Burgers vector mitigates strain energy.

SUMMARY OF THE INVENTION

In commercially available SiC substrates (for example, a 4H-SiC single crystal substrate having a size of 6 inches and a thickness of 350 μm), there are a certain number of SiC substrates which crack during growth of a SiC epitaxial layer.

When a substrate cracks during the growth of a SiC epitaxial layer, not only does the substrate become unusable, but also the operation of a growth furnace is hindered.

As a result of intensively examining the cause of cracks of the SiC substrate, the inventor has found that the cause of cracks was caused by micropipe-like defects (composite defects) existing at the edge portion (peripheral edge portion) of the SiC substrate with respect to a considerable percentage of the SiC substrates that crack during the growth of the SiC epitaxial layer, other than when the cause of cracks was unknown. The micropipe-like defects are defects typically having a hollow portion with a diameter (or a maximum length in a case of a shape which cannot be approximated as a circle) of approximately 5 to 500 μm and associated with dislocation lines extending from the hollow portion, although it is not particularly limited. Particularly, in a case where a defect is a hollow penetration defect in which a hollow portion penetrates from a front surface to a rear surface of a substrate, the defect often leads to a crack in a SiC substrate.

The present invention is contrived in view of the above-described problem, and an object thereof is to provide a SiC substrate in which there is hardly any cracking during the manufacture of a SiC epitaxial wafer, a SiC epitaxial wafer, and a method of manufacturing a SiC epitaxial wafer.

The present invention provides the following means in order to solve the above-described problem.

(1) A SiC substrate according to a first aspect of the present invention is a SiC substrate including a first principal surface, a second principal surface disposed on a side opposite to the first principal surface, and an outer periphery connected to the first principal surface and the second principal surface, wherein a density of composite defects present, at a peripheral edge portion of the SiC substrate, in which a hollow portion and a dislocation line extending from the hollow portion are connected to each other, is equal to or greater than 0.01 pieces/cm$^2$ and equal to or less than 10 pieces/cm$^2$.

(2) A SiC epitaxial wafer according to a second aspect of the present invention includes a SiC epitaxial layer on the SiC substrate according to (1) mentioned above.

(3) A method of manufacturing a SiC epitaxial wafer according to a third aspect of the present invention includes a step of forming a SiC epitaxial layer on the SiC substrate according to (1) mentioned above.

(4) A method of manufacturing a SiC epitaxial wafer according to a fourth aspect of the present invention includes a substrate selection step of selecting a SiC substrate, which is used in the SiC epitaxial wafer and includes a first principal surface, a second principal surface disposed on a side opposite to the first principal surface, and an outer periphery connected to the first principal surface and the second principal surface, wherein in the substrate selection step, a density of composite defects present at a peripheral edge portion of the SiC substrate, in which a hollow portion and a dislocation line extending from the hollow portion are connected to each other, is inspected, and a SiC substrate in which the density is equal to or less than a predetermined density is selected.

(5) A method of manufacturing a SiC epitaxial wafer according to a fifth aspect of the present invention includes a step of preparing a SiC wafer having a size larger than a predetermined size in order to obtain a SiC substrate having the predetermined size, and a substrate preparation step of preparing a SiC substrate used in the SiC epitaxial wafer, which includes a first principal surface, a second principal surface disposed on a side opposite to the first principal surface, and an outer periphery connected to the first principal surface and the second principal surface, wherein in the substrate preparation step, a SiC substrate is obtained by hollowing out a central portion of the SiC wafer, while leaving an outer ring portion of the SiC wafer in which a density of composite defects of the outer ring portion is equal to or greater than a predetermined density, the composite defects being configured such that a hollow portion and a dislocation line extending from the hollow portion are connected to each other.

The present invention can provide a SiC substrate that is difficult to crack during the manufacture of a SiC epitaxial wafer.

PREFERRED EMBODIMENTS

Hereinafter, a SiC substrate, a SIC epitaxial wafer, and a method of manufacturing the SiC epitaxial wafer according to an embodiment to which the present invention is applied will be described in detail with reference to the accompanying drawings. Meanwhile, in the drawings used in the following description, characteristic portions may be illustrated at an enlarged scale for convenience of easy understanding of characteristics, and the dimensional ratios and the like of the respective components are not necessarily the same as the actual ones. Further, in the following description, materials, dimensions, and the like are merely exemplary, do not limit the present invention, and can be appropriately modified within a range in which the effects are exerted.

(SiC Substrate)

Figure 1:
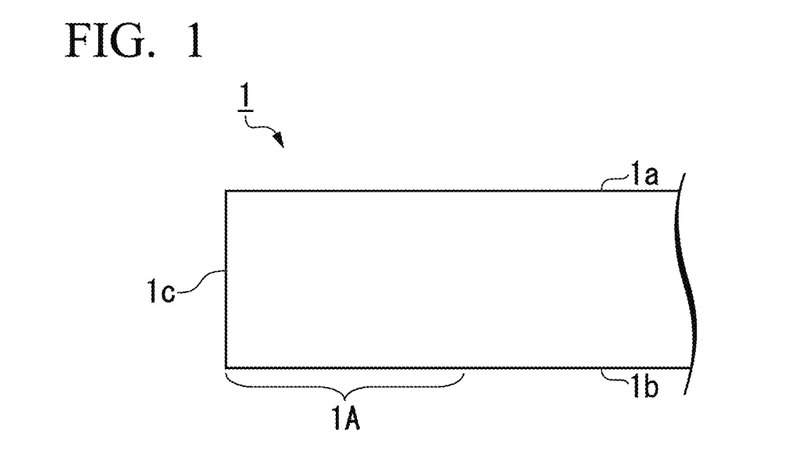
FIG. 1 is a schematic cross-sectional view of a portion of a SiC substrate according to an embodiment of the present invention.
Figure 2:
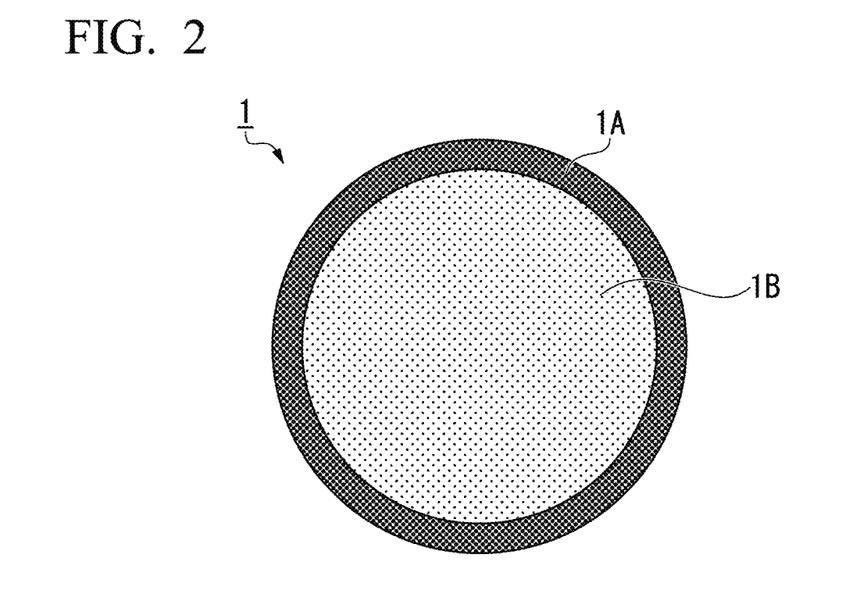
FIG. 2 is a schematic plan view of the SiC substrate according to the embodiment of the present invention.

FIG. 1 illustrates a schematic cross-sectional view of a portion of a SiC substrate according to an embodiment of the present invention. FIG. 2 illustrates a schematic plan view of the SiC substrate according to the embodiment of the present invention. A SiC substrate 1 is a SiC substrate including a first principal surface 1a, a second principal surface 1b disposed on a side opposite to the first principal surface 1a, and an outer periphery 1c connected to the first principal surface 1a and the second principal surface 1b. The density of composite defects present at a peripheral edge portion 1A of the SiC substrate, in which a hollow portion and a dislocation line extending from the hollow portion are connected to each other is equal to or greater than 0.01 pieces/cm$^2$ and equal to or less than 10 pieces/cm$^2$.

The reason why "the density of the composite defects is equal to or greater than 0.01 pieces/cm$^2$ and equal to or less than 10 pieces/cm$^2$" will be described.

Figure 9:
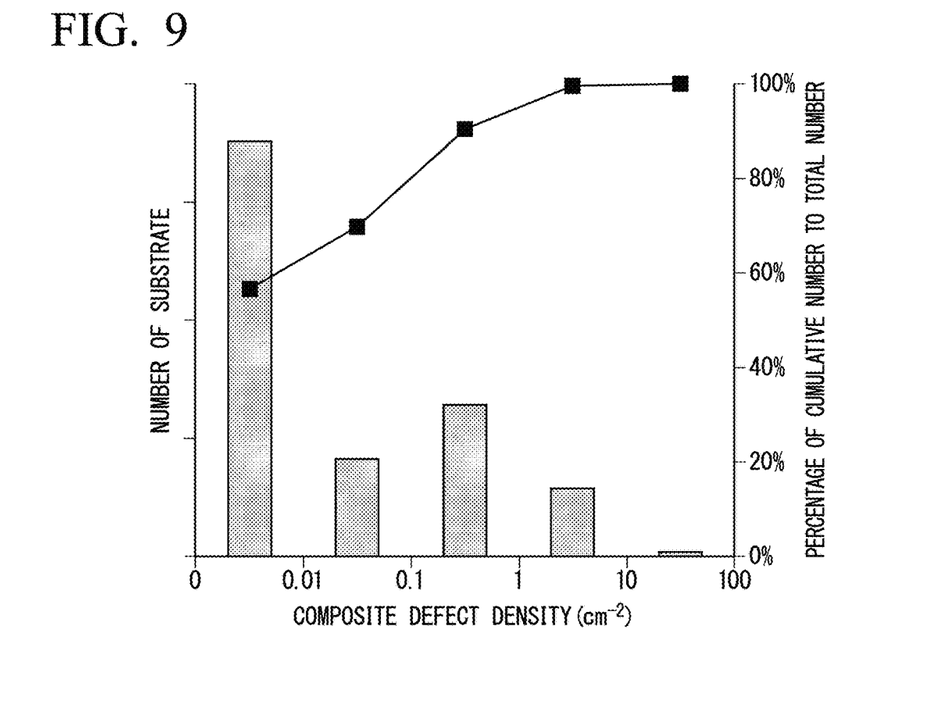
FIG. 9 shows results obtained by performing histogram analysis of composite defect densities at edge portions of 1000 or more SiC single crystal substrates.

The composite defect density at the peripheral edge of each of 1000 more commercially available 4 to 6 inch size, 350 μm thick 4H-SiC single crystalsubstrates was investigated. Next, the 4H-SiC single crystal substrates were classified according to a predetermined range of the composite defect density at the peripheral edge thereof. FIG. 9 shows the result of counting the number of 4H-SiC single crystal substrates which are classified to each predetermined range.

In FIG. 9, the horizontal axis represents a composite defect density, and the left vertical axis represents the number of SiC single crystal substrates falling within each composite defect density range (equal to or greater than 0 pieces/cm$^2$ and less than 0.01 pieces/cm$^2$, equal to or greater than 0.01 pieces/cm$^2$ and less than 0.1 pieces/cm$^2$, equal to or greater than 0.1 pieces/cm$^2$ and less than 1 piece/cm$^2$, equal to or greater than 1 piece/cm$^2$ and less than 10 pieces/cm$^2$, and equal to or greater than 10 pieces/cm$^2$ and less than 100 pieces/cm$^2$). The right verticals represents the percentage of the cumulative number of SiC single crystal substrates belonging to each complex defect density range which are accumulated in order from the smallest complex defect density range, with respect to the total number of SiC single crystal substrates. Accordingly, when the accumulation is performed up to a range of 10 pieces/cm$^2$ to 100 pieces/cm$^2$ from the smallest complex defect density range, it is 100%.

In FIG. 9, in the case of a SiC single crystal substrate having a composite defect density at the peripheral edge of 1 piece/cm$^2$ or more and 10 pieces/cm$^2$ or less, the ratio (probability) of occurrence of cracks during the growth of the SiC epitaxial layer was 1% or less. In the case of an SiC single crystal substrate having a composite defect density at the peripheral edge of zero, the rate (probability) of occurrence, of cracks due to the composite defects during the growth of the SiC epitaxial layer is naturally zero. If the SiC single crystal substrate has a composite defect density at the peripheral ice 0.01/cm$^2$ or more and less than 0.1/cm$^2$, the rate (probability) of occurrence of cracks during the growth of the SIC epitaxial layer is 0.1% or less, which is very low as the rate of occurrence of cracks.

The inventor found composite defects present at a peripheral edge portion of the SiC substrate, and found that the composite defects are a main cause of cracks of the SiC substrate during the growth of the SiC epitaxial layer. Further, the inventor examined a relationship between the density of composite defects present at the peripheral edge portion of a SIC substrate and the probability of the occurrence of cracks during the growth of a SIC epitaxial layer. Accordingly, where are SiC substrate having a crack occurrence rate (probability) of 1% or less during the growth of the SiC epitaxial layer is acceptable in terms of the ratio of the usable substrate and the manufacturing cost, the inventor has found that a SIC substrate having a composite defect density of equal to or greater than 0.01 pieces/cm$^2$ and equal to or less than 10 pieces/cm$^2$ at the peripheral edge portion satisfies the condition of the crack occurrence rate of of 1% or less. That is, if a SiC substrate having a composite defect density of 10 pieces s/cm$^2$ or less is used, the crack generation ratio can be reduced to 1% or less during the grow of the SIC epitaxial layer.

If only the SiC substrate having the composite defect density of zero at the peripheral edge portion is used, the crack generation ratio can be made zero during the growth of the SIC epitaxial layer. However, in this case, nowadays, with the substrate supply amount tightening, 40% of substrates having a composite defect density of 0.01 pieces/cm$^2$ or more become unusable, which is not suitable with regard to manufacturing costs. Consequently, when the composite defect density of the usable substrate is 0.01 pieces/cm$^2$ or more, the manufacturing cost can be allowed.

A crack occurrence rate of SiC substrates having a composite defect density of greater than 10 pieces/cm$^2$ is greater than 1%. For example, if the monthly production is 10,000, even if the crack generation rate slightly exceeds 1%, cracks occur once a month or more, which has a significant effect on the growth furnace. Therefore, a crack generation rate slightly exceeding 1% is not acceptable.

In the present specification, the "peripheral edge portion" refers to an annular portion when seen in plan view within a range of 3 mm from the outer periphery to the inside of a SiC substrate. The SiC substrate 1 includes the peripheral edge portion 1A and an inner portion 1B when seen in plan view.

In the present specification, a "composite defect" refers to a defect in which a hollow portion and a dislocation line extending from the hollow portion are connected to each other. In some cases, adjacent composite defects share dislocation lines. The number or density of composite defects is measured as the number or density of hollow portions separated each other in a confocal microscope image.

Here, examples of the "hollow portion" can include hollow penetration defects called micropipes, but are not limited thereto. Examples include hollow portions having a size of 5 µm or more (a length in the longest direction) when seen in plan view. The hollow portion can be observed using, for example, a confocal microscope having a confocal differential interference optical system or a photoluminescence apparatus.

In addition, the "dislocationline" can be observed using, for example, a photoluminescence apparatus.

A single crystal substrate is preferably used as the SiC substrate of the present embodiment.

As the SiC substrate of the present embodiment, a polytype is not limited, but 4H is preferably used.

In a case where a 4H-SiC single crystal substrate is used as the SiC substrate of the present embodiment, a 4H-SiC single crystal substrate having an off-angle can be used. A 4H-SiC single crystal substrate having any off-angle can be used, but a 4H-SiC single crystal substrate having a small off-angle of, for example, greater than 0 degrees and equal to or less than 8 degrees is preferably used from the viewpoint, of cost reduction. Typically, a 4H-SiC single crystal substrate having an off-angle of 4 degrees may be exemplified.

The thickness of the SiC substrate of the present embodiment is not particularly limited, but a SiC substrate having a thickness of, for example, equal to or greater than 150 µm and equal to or less than 550 µm can be used. Preferably, a SiC substrate having a thickness of equal to or greater than 300 µm and equal to or less than 400 µm can be used.

The size of the SiC substrate of the present embodiment is not particularly limited, but a SiC substrate having a size of, for example, equal to or greater 3 inches and equal to or less than 6 inches can be used.

Figure 3A:
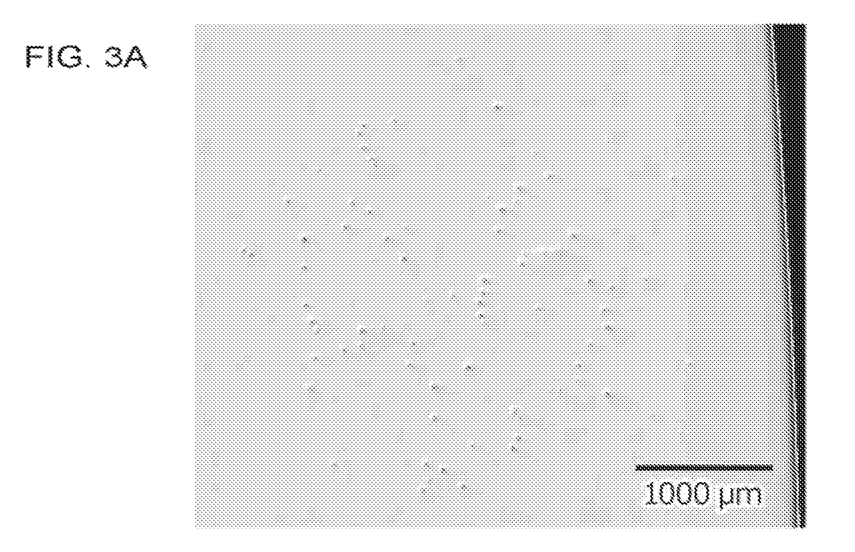
FIG. 3A is an optical microscope image of the vicinity of a peripheral edge portion of a 4H-SiC single crystal substrate.
Figure 3B:
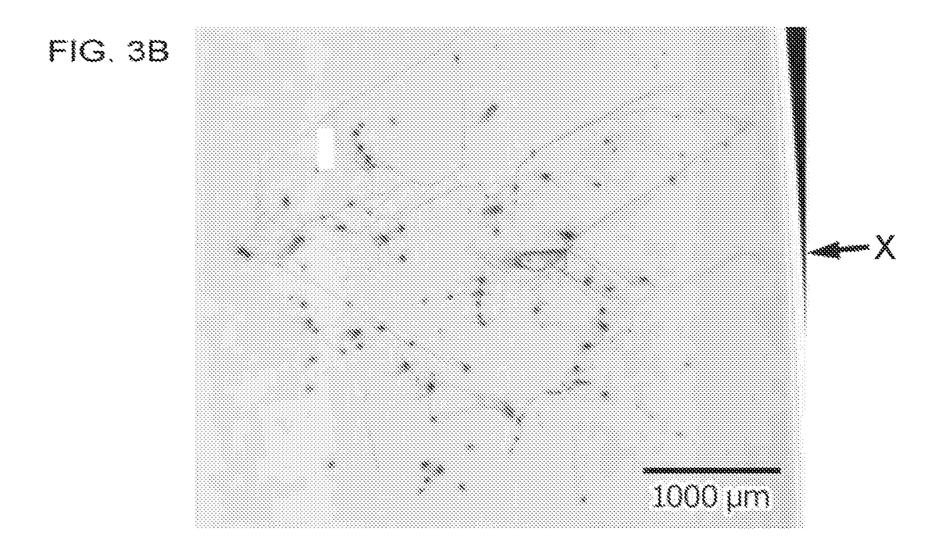
FIG. 3B is a PL image of the same location as that in FIG. 3A.

FIG. 3A shows an optical microscope image of the vicinity of a peripheral edge portion of a 4H-SiC single crystal substrate (an off-angle of 4 degrees with respect to a c plane), and FIG. 3B shows a photoluminescence (PL) image of the same portion as that in FIG. 3A. The optical microscope image and the PL image were obtained using an inspection apparatus (manufactured by Lasertec Corporation, SICA88) which is provided with a confocal differential interference microscope and a photoluminescence observation function. Meanwhile, a long-pass filter (≥660 nm) was used for PL observation.

When the optical microscope image shown in FIG. 3A and the PL image shown in FIG. 3B are compared with each other, the positions of hollow portions of composite defects correspond to each other. On the other hand, a dislocation line can be observed in only the PL image.

It can be understood that a dislocation line of a composite defect in the FL image shown in FIG. 3B extends to an outer edge, as shown by an arrow X. There is a tendency for a rate at which cracks occur in a manufacturing process to become higher as the number of composite defects extending to the outer edge increases.

Figure 4A:
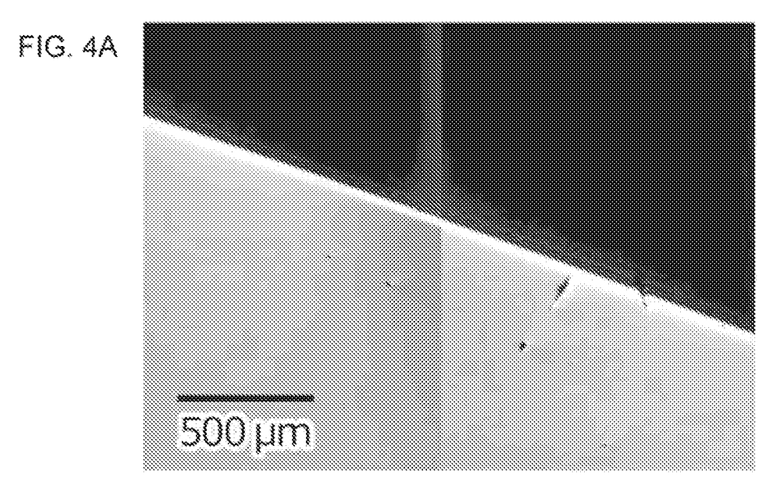
FIG. 4A is an optical microscope image of the vicinity of a peripheral edge portion of another 4H-SiC single crystal substrate.
Figure 4B:
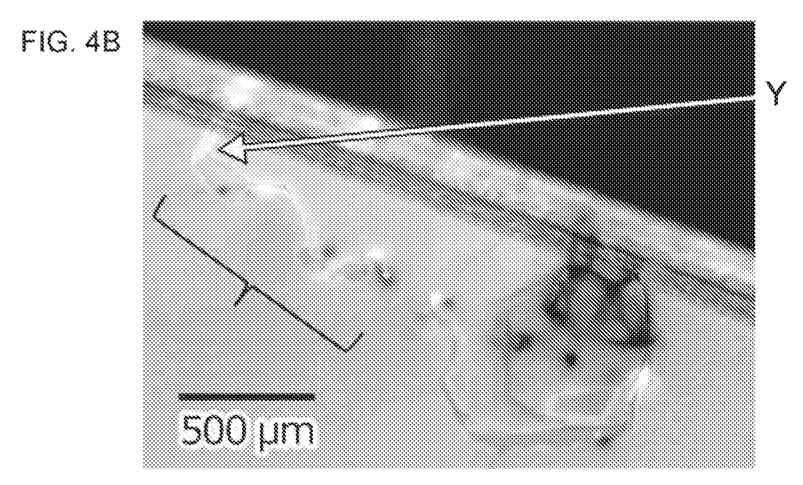
FIG. 4B is a PL image of the same location as that in FIG. 4A.

FIG. 4A shows an optical microscope image of the vicinity of a peripheral edge portion of another 4H-SiC single crystal substrate (an off-angle of 4 degrees with respect to a c plane), and FIG. 4B shows a photoluminescence (PL) image. FIG. 4A and FIG. 4B are images of the same portion.

Also in the PL image shown in FIG. 4B, it can be understood that a dislocation line of a composite defect extends to an outer edge of the substrate, as shown by an arrow Y.

Further, in composite defects in the PL image shown in FIG. 4B, adjacent composite defects are connected to each other by a dislocation line as indicated by braces mark, and a dislocation line of a composite defect closest to the outer edge extends to the outer edge.

Figure 5A:
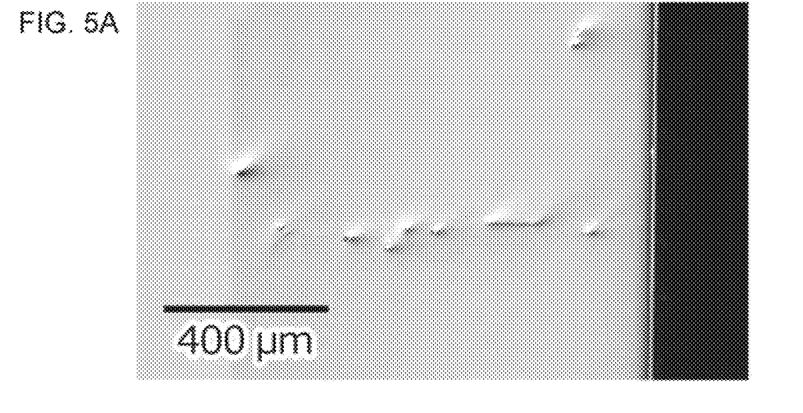
FIG. 5A is an optical microscope image of the vicinity of a peripheral edge portion of still another 4H-SiC single crystal substrate.
Figure 5B:
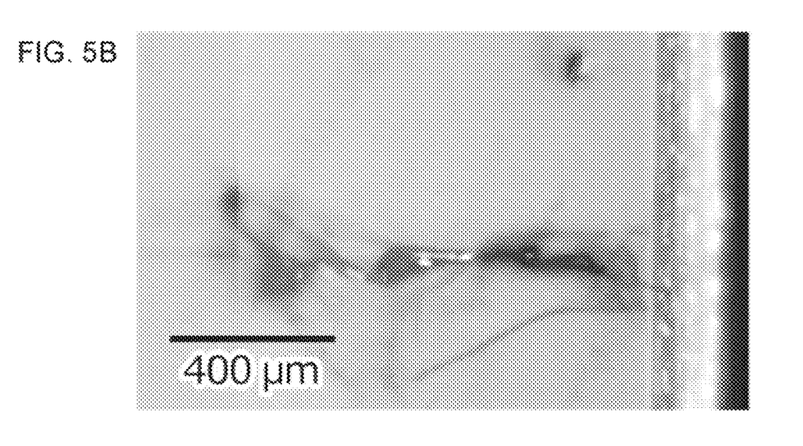
FIG. 5B is a PL image of the same location as that in FIG. 5A.

FIG. 5A shows an optical microscope image of the vicinity of a peripheral edge portion of still another 4H-SiC single crystal substrate (an off-angle of 4 degrees with respect to a c plane), and FIG. 5B shows a photoluminescence (PL) image. FIG. 5A and FIG. 5B are images of the same portion.

Also in the PL image shown in FIG. 5B, it can be understood that a dislocation line of a composite defect extends to an outer edge of the substrate.

In addition, composite defect groups in the PL image shown in FIG. 5B are connected to each other in order by dislocation lines and arranged to the outer edge of the substrate.

Figure 6A:
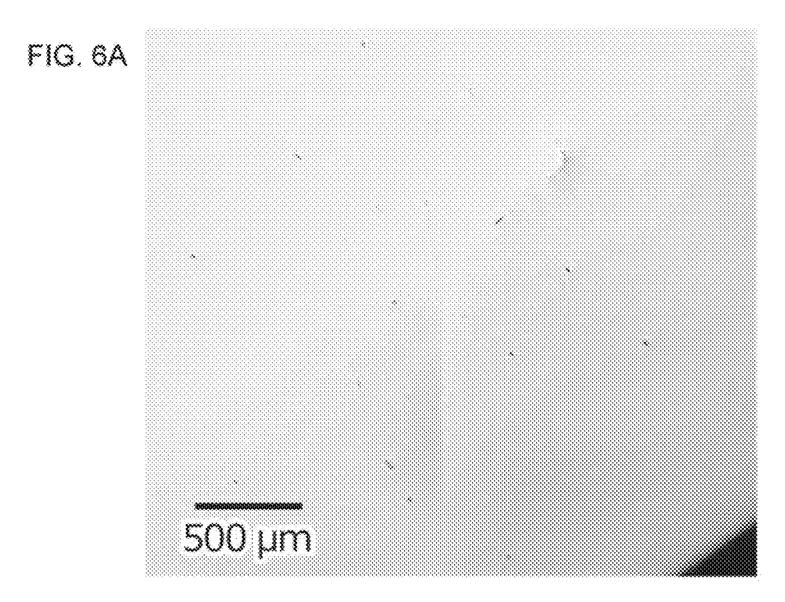
FIG. 6A is an optical microscope image of the vicinity of a peripheral edge portion of still another 4H-SiC single crystal substrate.
Figure 6B:
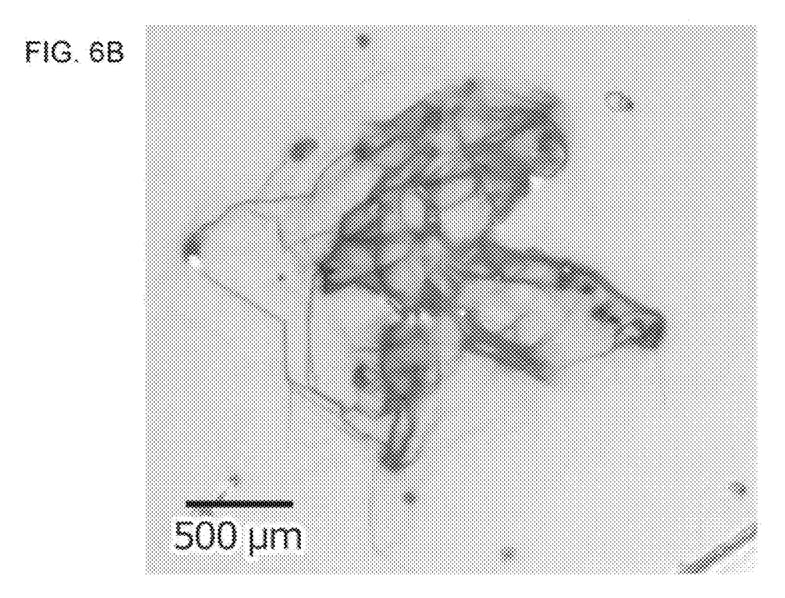
FIG. 6B is a PL image of the same location as that in FIG. 6A.

FIG. 6A shows an optical microscope image of the vicinity of a peripheral edge portion of still another 4H-SiC single crystal substrate (an off-angle of 4 degrees with respect to a c plane), and FIG. 6B shows a photoluminescence (PL) image. FIG. 6A and FIG. 6B are images of the same portion.

In the PL image shown in FIG. 6B, dislocation lines do not extend to the outer edge of the substrate, but it can be understood that a plurality of adjacent composite defect groups are connected to each other by the dislocation lines.

Figure 7A:
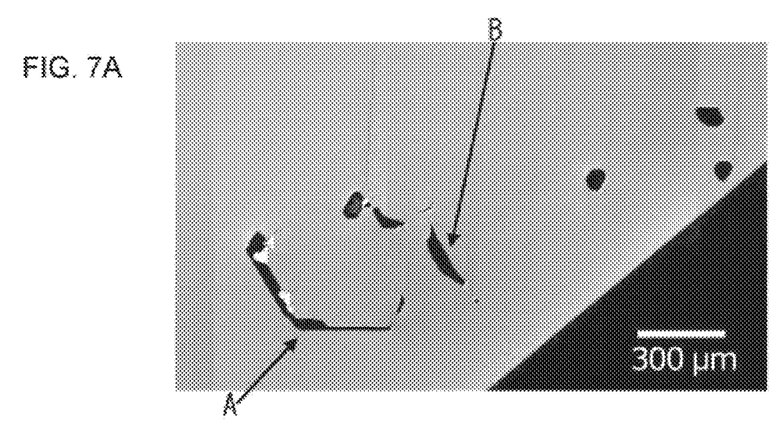
FIG. 7A is an optical microscope image of the vicinity of a peripheral edge portion of still another 4H-SiC single crystal substrate.
Figure 7B:
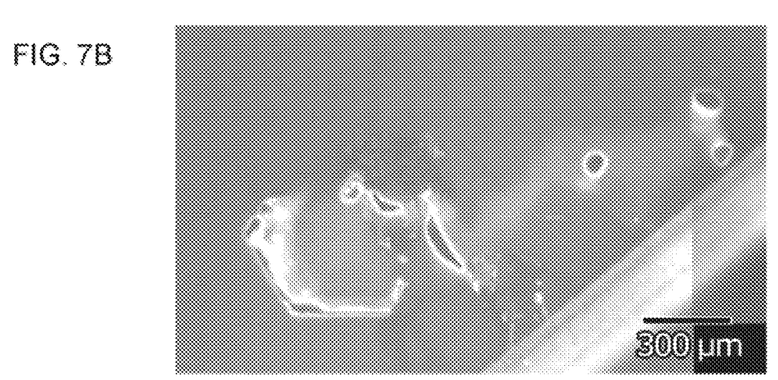
FIG. 7B is a PL image of the same location as that in FIG. 7A.

FIG. 7A shows an optical microscope image of the vicinity of a peripheral edge portion of still another 4H-SiC single crystal substrate (an off-angle of 4 degrees with respect to a c plane), and FIG. 7B shows a photoluminescence (PL) image. FIG. 7A and FIG. 7B are images of the same portion.

Figure 7C:
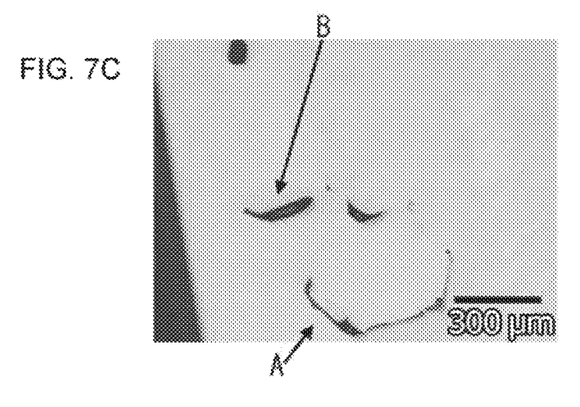
FIG. 7C is an optical microscope image of a rear surface of the same location as that in FIG. 7A.

FIG. 7C shows an optical microscope image of a rear surface (a surface on a side opposite to those in FIGS. 7A and 7B) of the same portion when seen in plan view.

FIG. 7A and FIG. 7C respectively show the same hollow portions indicated by sign A and sign B.

Hollow portions of composite defects observed in the images shown in FIGS. 7A to 7C are defects penetrating from a front surface (a first principal surface) to a rear surface (a second principal surface) of the substrate.

(SiC Epitaxial Wafer)

The SiC epitaxial wafer according to the embodiment of the present invention includes a SiC epitaxial layer on the SiC substrate of the present invention.

The SiC epitaxial wafer according to the embodiment of the present invention can be manufactured through a known SiC epitaxial growth step of growing a SiC epitaxial layer.

The thickness of the SiC epitaxial layer is not particularly limited, but can be set to be, for example, equal to or greater than 5 μm and equal to or less than 100 μm.

Method of Manufacturing SiC Epitaxial Wafer
(First Embodiment)

A method of manufacturing a SiC epitaxial wafer according to a first embodiment of the present invention includes a substrate selection step of selecting a SiC substrate which is used in the SiC epitaxial wafer and includes a first principal surface, a second principal surface disposed on a side opposite to the first principal surface, and an outer periphery connected to the first principal surface and the second principal surface. In the substrate selection step, the density of composite defects present at a peripheral edge portion of the SiC substrate, in which a hollow portion and a dislocation line extending from the hollow portion to the outer periphery side are connected to each other, is inspected, and a SiC substrate in which the density is equal to or less than a predetermined density is selected.

Known steps can be used for the other steps.

The predetermined density can be set to equal to or less than 10 pieces/cm$^2$. However, in order to select a SiC substrate which is less likely to crack, the predetermined density is preferably set to equal to or less than 1 piece/cm$^2$, more preferably set to equal to or less than 0.1 pieces/cm$^2$, and further preferably set to equal to or less than 0.01 pieces/cm$^2$.

Method of Manufacturing SiC Epitaxial Wafer
(Second Embodiment)

Figure 8:
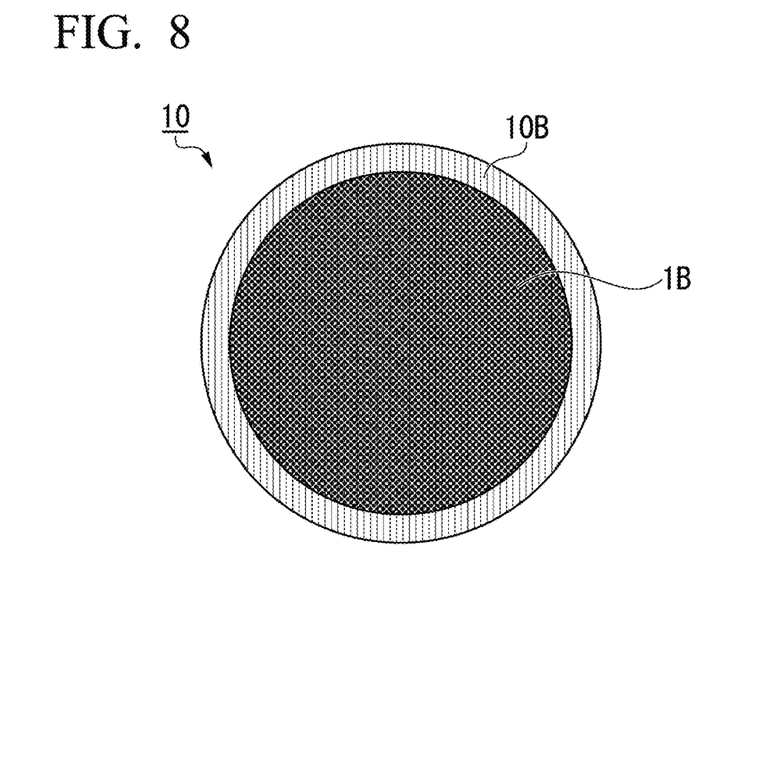
FIG. 8 is a schematic plan view of a SiC wafer illustrating a method of manufacturing a SiC epitaxial wafer according to a second embodiment of the present invention.

FIG. 8 is a schematic plan view of a SiC wafer illustrating a method of manufacturing a SiC epitaxial wafer according to a second embodiment of the present invention.

A method of manufacturing a SiC epitaxial wafer according to the second embodiment of the present invention includes a step of preparing a SiC wafer 10 having a size larger than a predetermined size R in order to obtain a SiC substrate 10A having the predetermined size, and a substrate preparation step of preparing a SiC substrate which is used in the SiC epitaxial wafe, which includes a first principal surface, a second principal surface disposed on a side opposite to the first principal surface, and an outer periphery connected to the first principal surface and the second principal surface. In the substrate preparation step, a SiC substrate is obtained by hollowing out a central portion 10A of the SiC wafer 10, while leaving an outer ring portion 10B of the SiC wafer 10 in which the density of composite defects of the outer ring portion 10B is equal to or greater than a predetermined density, the composite defects being configured such that a hollow portion and a dislocation line extending from the hollow portion to the outer periphery side are connected to each other.

Known steps can be used for the other steps.

The predetermined density can be set to equal to or less than 10 pieces/cm$^2$. However, in order to select a SiC substrate which is more difficult to crack, the predetermined density is preferably set to equal to or less than 1 piece/cm$^2$, more preferably set to equal to or less than 0.1 pieces/cm$^2$, and further preferably set to equal to or less than 0.01 pieces/cm$^2$.

EXPLANATION OF REFERENCES

1 SiC Substrate
1a First Principal Surface
1b Second Principal Surface
1c Outer Periphery
1A Peripheral Edge Portion

What is claimed is:

1. A SiC substrate, comprising:
   a first principal surface;
   a second principal surface disposed on a side opposite to the first principal surface; and
   an outer periphery connected to the first principal surface and the second principal surface,
   wherein a density of composite defects present at a peripheral edge portion of the SiC substrate, in which a hollow portion and a dislocation line extending from the hollow portion are connected to each other, is equal to or greater than 0.01 pieces/cm$^2$ and equal to or less than 10 pieces/cm$^2$.

2. A SiC epitaxial wafer, comprising:
   a SiC epitaxial layer on the SiC substrate according to claim 1.

3. A method of manufacturing a SiC epitaxial wafer, comprising:
   a step of forming a SiC epitaxial layer on the SiC substrate according to claim 1.

4. A method of manufacturing a SiC epitaxial wafer, comprising:
   a substrate selection step of selecting a SiC substrate, which is used in the SiC epitaxial wafer and includes a first principal surface, a second principal surface disposed on a side opposite to the first principal surface, and an outer periphery connected to the first principal surface and the second principal surface, wherein in the substrate selection step, a density of composite defects present at a peripheral edge portion of the SiC substrate, in which a hollow portion and a dislocation line extending from the hollow portion are connected to each other, is inspected, and a SiC substrate in which the density is equal to or less than a predetermined density is selected.

5. A method of manufacturing a SiC epitaxial wafer, comprising:

a step of preparing a SiC wafer having a size larger than a predetermined size in order to obtain a SiC substrate having the predetermined size; and a substrate preparation step of preparing a SiC substrate used in the SiC epitaxial wafer, which includes a first principal surface, a second principal surface disposed on a side opposite to the first principal surface, and an outer periphery connected to the first principal surface and the second principal surface, wherein in the substrate preparation step, a SiC substrate is obtained by hollowing out a central portion of the SiC wafer, while leaving an outer ring portion of the SiC wafer in which a density of composite defects of the outer ring portion is equal to or greater than a predetermined density, the composite defects being configured such that a hollow portion and a dislocation line extending from the hollow portion are connected to each other.

* * * * *